(12) United States Patent
Schrott et al.

(10) Patent No.: US 7,960,203 B2
(45) Date of Patent: Jun. 14, 2011

(54) PORE PHASE CHANGE MATERIAL CELL FABRICATED FROM RECESSED PILLAR

(75) Inventors: Alejandro G. Schrott, New York, NY (US); Chung H. Lam, Peekskill, NY (US); Eric A. Joseph, White Plains, NY (US); Matthew J. Breitwisch, Yorktown Heights, NY (US); Roger W. Cheek, Somers, NY (US)

(73) Assignee: International Business Machines Corporation, Armonk, NY (US)

( * ) Notice: Subject to any disclaimer, the term of this patent is extended or adjusted under 35 U.S.C. 154(b) by 518 days.

(21) Appl. No.: 12/021,577

(22) Filed: Jan. 29, 2008

(65) Prior Publication Data
US 2009/0189139 A1    Jul. 30, 2009

(51) Int. Cl.
*H01L 21/00* (2006.01)
(52) U.S. Cl. ............... 438/84; 438/95; 438/102; 257/3; 257/E45.002
(58) Field of Classification Search .................. None
See application file for complete search history.

(56) References Cited

U.S. PATENT DOCUMENTS

| | | | |
|---|---|---|---|
| 7,324,365 B2 * | 1/2008 | Gruening-von Schwerin et al. | 365/148 |
| 7,488,967 B2 * | 2/2009 | Burr et al. | 257/2 |
| 7,541,609 B2 * | 6/2009 | Nirschl et al. | 257/4 |
| 7,579,616 B2 * | 8/2009 | Chen et al. | 257/8 |
| 7,642,622 B2 * | 1/2010 | Yi et al. | 257/613 |
| 7,671,353 B2 * | 3/2010 | Philipp et al. | 257/2 |
| 7,719,886 B2 * | 5/2010 | Philipp et al. | 365/163 |
| 7,728,319 B2 * | 6/2010 | Goux et al. | 257/3 |
| 2007/0246439 A1 * | 10/2007 | Lee et al. | 216/37 |
| 2008/0149909 A1 * | 6/2008 | Philipp et al. | 257/3 |

* cited by examiner

*Primary Examiner* — Zandra Smith
*Assistant Examiner* — Khanh B Duong
(74) *Attorney, Agent, or Firm* — Scully, Scott, Murphy & Presser, P.C.; Vazken Alexanian

(57) ABSTRACT

A method of manufacturing an electrode is provided that includes providing a pillar of a first phase change material atop a conductive structure of a dielectric layer; or the inverted structure; forming an insulating material atop dielectric layer and adjacent the pillar, wherein an upper surface of the first insulating material is coplanar with an upper surface of the pillar; recessing the upper surface of the pillar below the upper surface of the insulating material to provide a recessed cavity; and forming a second phase change material atop the recessed cavity and the upper surface of the insulating material, wherein the second phase change material has a greater phase resistivity than the first phase change material.

18 Claims, 4 Drawing Sheets

PORE PHASE CHANGE MATERIAL CELL FABRICATED FROM RECESSED PILLAR

FIELD OF THE INVENTION

In one embodiment, the present invention relates to memory devices.

BACKGROUND OF THE INVENTION

Phase change memory (PCM) devices store data using a phase change material, such as, for example, a chalcogenide alloy, that transforms into a crystalline state or an amorphous state. An electrode may provide a current to the PCM device to produce heat that effectuates phase changes in PCM between crystalline and amorphous phases. Each state of the phase change material has different resistance characteristics. Specifically, the phase change material in the crystalline state has low resistance and the phase change material in the amorphous state has high resistance. The crystalline state is typically referred to as a "set state" having a logic level "0", and the amorphous state is typically referred to as a Preset states having a logic level "1".

SUMMARY OF THE INVENTION

The present invention, in one aspect provides a memory device having a first phase change material of a first resistivity in direct physical contact, i.e., in abutting relationship, with a second phase change material of a second resistivity. In one embodiment, the first phase change material having the first resistivity is positioned on the second phase change material having the second resistivity, wherein a barrier metal is positioned at the interface of the first phase change material and the second phase change material. In one embodiment, the first phase change material may remain in a low conductivity crystalline state to provide at least a portion of a thermally insulated sublithographic electrode that contributes to minimize the reset power of the device.

In one embodiment, the memory device includes:

a first phase change material; and a second phase change material comprising a first portion positioned on the first phase change material and having a first width substantially equal to a width of the first phase change material, and a second portion having a second width greater than the first width, wherein the second phase change material has a greater phase resistivity than the first phase change material.

In one embodiment, the first phase change material is in direct physical contact with the second phase change material. In another embodiment, an interface barrier metal is positioned between, i.e., positioned on, the first phase change material and the second phase change material. The interface barrier metal may be in direct physical contact with at least one of the first phase change material and the second phase change material. In one embodiment, the interface barrier metal is in direct physical contact with both of the first and the second phase change materials.

In one embodiment of the memory device, the first phase change material and the second phase change material are composed of a material including Ge, Sb, or Te or a combination thereof. In one embodiment, the first phase change material is of high purity and the second phase change material is doped. In one embodiment, the first phase change material is composed of pure $Ge_2Sb_2Te_5$, and the second phase change material is composed of $G_2Sb_2Te_5$ doped with a nitride, oxide, or oxynitride dopant. In one embodiment, the first portion of the second phase change material is in direct physical contact with the first phase change material. In another embodiment, an interposed barrier metal separates the first phase change material from the first portion of the second phase change material.

In one embodiment, the first width of the first portion of the second phase change material ranges from about 0 nm to about 50 nm, and the second width of the second portion of the second phase change material portion ranges from about 10 nm to about 50 nm. In one embodiment, the second portion of the second phase change material may further include a third width, wherein the third width of the second portion of the second phase change material is greater than the second width of the second portion of the second phase change material. In one embodiment, the resistivity of the amorphous phase of the second phase change material is greater than the resistivity of the amorphous phase of the first phase change material. In one embodiment, the resistivity of the crystalline phase of the second phase change material is greater than the resistivity of the crystalline phase of the first phase change material. In one embodiment, the resistivity of the first phase change material ranges from about $10^{-6}$ ohm-m to about $10^2$ ohm-m, and the resistivity of the second phase change material ranges from about $10^{-2}$ ohm-m to about $10^{+5}$ ohm-m.

In another aspect, the present invention provides a method of forming a memory device. In one embodiment, the inventive method of forming a memory device includes:

providing a pillar of at least a first phase change material positioned on a conductive structure positioned in a dielectric layer;

forming an insulating material abutting the pillar of the first phase change material and atop the conductive structure, wherein an upper surface of the insulating material is coplanar with an upper surface of the pillar;

recessing the upper surface of the pillar below the upper surface of the insulating material to provide a recessed pillar; and forming a second phase change material atop the recessed pillar and the upper surface of the insulating material, wherein the second phase change material has a greater phase resistivity than the first phase change material.

In one embodiment, the pillar further includes an interface barrier metal positioned on an upper surface of the first phase change material. In one embodiment, the interface barrier metal is in direct physical contact with the first and the second phase change materials. In one embodiment of the method for forming a memory device, the pillar may have a width that is less than the width of the conductive structure. In one embodiment, the pillar may further include a first barrier metal positioned between, i.e. positioned on, the first phase change material and the conductive structure. In another embodiment, the first barrier metal is in direct physical contact with the upper surface of the conductive structure and the lower surface of the first phase change material. In another embodiment, a second barrier metal is positioned on the upper surface of the second phase change material. In one embodiment, the second barrier metal is in direct physical contact with the upper surface of the second phase change material. In one embodiment, the conductive structure may be a metal stud composed of W, and the first and second barrier metal of the pillar may be composed of TiN or TaN.

In one embodiment, the step of providing the pillar includes depositing a layer of the first barrier metal atop the conductive structure and the dielectric layer; depositing a layer of the first phase change material atop the layer of the first barrier metal; forming a block mask atop a portion of the layer of the first phase change material, wherein a remaining portion of the layer of the first phase change material is exposed; trimming the block mask to achieve sublithographic dimensions; removing the remaining portion of the layer of the first phase change material and the portions the first barrier metal underlying the remaining portion of the layer of the first phase change material with an anisotropic etch step; and removing the block mask. In one embodiment, the first phase change material is composed of pure $Ge_2Sb_2Te_5$. In another embodiment, the step of providing the pillar includes depositing an interface barrier metal atop the first phase change material.

In one embodiment, the step of recessing the upper surface of the pillar includes etching the first phase change material selective to the insulating material until the upper surface of the pillar is recessed to a depth below the upper surface of the insulating material resulting in the formation of a cavity. In another embodiment when an interface barrier metal is positioned on the first phase change material, the step of recessing the upper surface of the pillar includes etching the interface barrier metal selectively to the insulating material until the upper surface of the interface barrier metal is recessed to a depth below the upper surface of the insulating material resulting in the formation of a cavity. In one embodiment, the upper surface of the pillar may be recessed to a depth ranging from about 0 nm to about 50 nm from the upper surface of the insulating material.

In one embodiment, the step of forming the second phase change material atop the recessed pillar and the upper surface of the insulating material includes depositing a first layer of the second phase change material atop the recessed pillar and the insulating material; planarizing the first layer of the second phase change material until an upper surface of the second phase change material within the cavity is coplanar with the upper surface of the insulating material; and depositing a second layer of the phase change material atop the upper surface of the second phase change material within the cavity and the upper surface of the insulating material. In one embodiment, the second phase change material is composed of $Ge_2Sb_2Te_5$ doped with a nitride, oxide, or oxynitride dopants.

BRIEF DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which.

DETAILED DESCRIPTION OF THE INVENTION

Figure 1A:
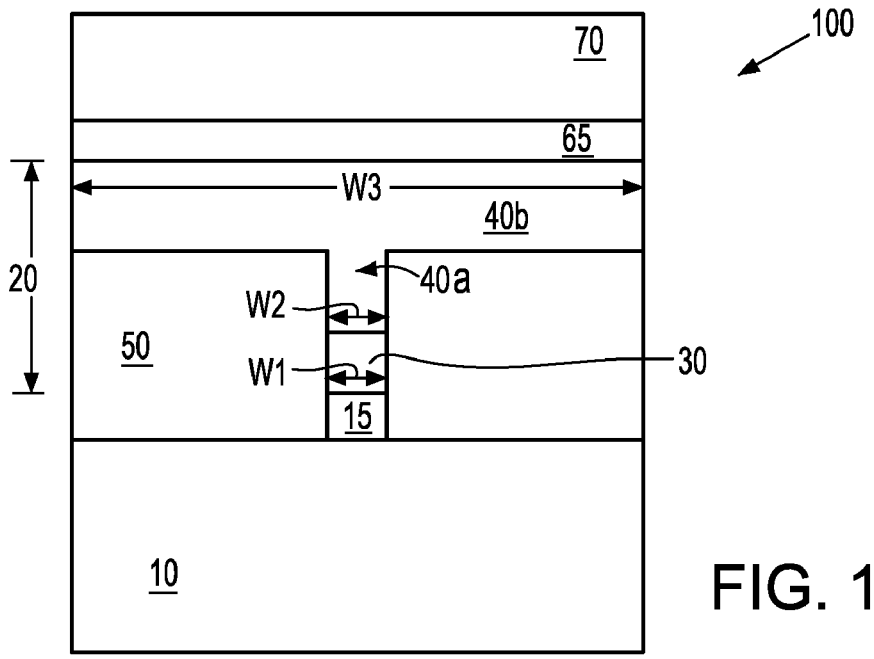
FIG. 1A is a side cross sectional view depicting one embodiment of a phase change memory device including a memory cell having a first change material in direct physical contact with a second phase change material, in accordance with the present invention.

Detailed embodiments of the present invention are disclosed herein; however, it is to be understood that the disclosed embodiments are merely illustrative of the invention that may be embodied in various forms. In addition, each of the examples given in connection with the various embodiments of the invention are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

The embodiments of the present invention relate to novel methods for forming memory devices. When describing the inventive structures and methods, the following terms have the following meanings, unless otherwise indicated.

As used herein, the term "memory device" means a structure in which the electrical state of which can be altered and then retained in the altered state; in this way a bit of information can be stored.

"Electrically conductive" and/or "electrically communicating" as used through the present disclosure means a material having a room temperature conductivity of greater than $10^{-8} \, (\Omega\text{-m})^{-1}$.

The term "electrical contact" denotes contact between two materials, wherein the interface between the two materials is electrically conductive.

The term "abutting" means that a first material contacts a second material.

The terms "overlying", "atop", "positioned on" or "positioned atop" means that a first element, such as a first structure, e.g. a first layer, is present on a second element, such as a second structure, e.g. a second layer, wherein intervening elements, such as an interface structure, e.g. interface layer, may be present between the first element and the second element.

The term "direct physical contact" means that a first element, such as a first structure, e.g., first phase change material, and a second element, such as a second structure, e.g., second phase change material, are connected without any intermediary conducting, insulating or semiconducting layers at the interface of the two materials.

As used herein, a "metal" is an electrically conductive material, wherein in metal atoms are held together by the force of a metallic bond; and the energy band structure of metal's conduction and valence bands overlap, and hence, there is no energy gap.

As used herein, a "phase change material" denotes a material that converts from an amorphous phase to a crystalline phase upon the application of energy.

As used herein, a "phase change memory cell" means a structure including at least one phase change material that is interposed between two contacts, where at least a portion of the phase change material can be switched from an amorphous state into a crystalline state, and vise-versa, by application of energy, wherein the crystalline state has a lower resistivity than the amorphous state.

"Phase resistivity" as used to compare the resistivity of the first phase change material and the second phase change material means that the resistivity of one of the phase change materials is compared to the other of the phase change materials when both phase change materials have substantially the same microstructure, i.e., when both phase change materials are in a substantially crystalline phase or when both phase change materials are in a substantially amorphous phase.

As used herein, the term "pure $Ge_2Sb_2Te_5$" means a phase change material composed solely of Ge, Sb, and Te with only incidental impurities or less.

"Incidental impurities" means elements that are present in less than 0.5 atomic wt. %.

As used herein, the term "doped" means a concentration of an element that is purposely provided in a base material, wherein the dopant concentration may range from about 1 atomic wt. % to about 15 atomic wt. %.

As used herein, a "barrier metal" is a material used to chemically isolate the phase change material from other materials and provides an electrical contact between them.

As used herein, the terms "insulating" and "dielectric" denote a material having a room temperature conductivity of less than about $10^{-10}$ $(\Omega\text{-m})^{-1}$.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", "beneath", "underlying", "below", "overlying" and derivatives thereof shall relate to the invention, as it is oriented in the drawing figures.

FIG. 1A depicts one embodiment of a memory device 100, in accordance with the present invention. In one embodiment, the inventive memory device 100 includes a first phase change material 30 having a singular width $W_1$; and a second phase change material 40 comprising a first portion 40a that is in direct physical contact with the first phase change material 30 and having a first width $W_2$ substantially equal to the singular width $W_1$ of the first phase change material 30, and a second portion 40b having a second width $W_3$ greater than the first width $W_2$ of the first portion 40a of the second phase change material 40, wherein the second phase change material 40 has a greater phase resistivity than the first phase change material 30.

Figure 1B:
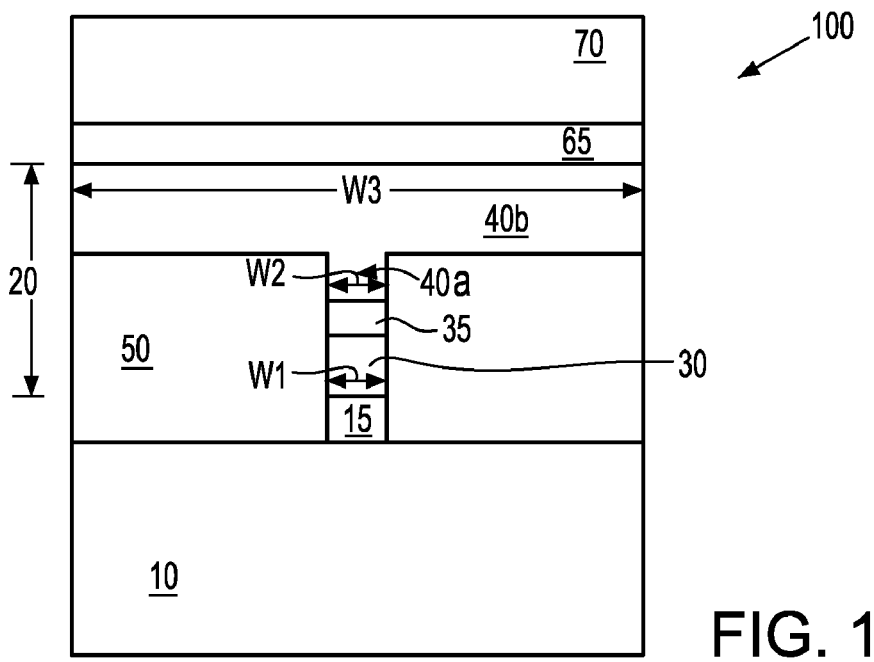
FIG. 1B is a side cross sectional view depicting one embodiment of a phase change memory device including a memory cell having an interface barrier metal positioned between, i.e., positioned on, a first phase change material and a second phase change material, in accordance with the present invention.

FIG. 1B depicts another embodiment of the memory device 100 of the present invention, wherein an interface barrier metal 35 is positioned between, i.e., positioned on, the first phase change material 30 and the second phase change material 40. The interface barrier metal 35 may be in direct physical contact with at least one of the first phase change material 30 and the second phase change material 40. In one embodiment, the interface barrier metal 35 is in direct physical contact with both of the first and the second phase change materials 30, 40. In embodiment, the inventive memory device 100 includes a first phase change material 30 having a singular width $W_1$ and interface barrier material 35 having a width substantially equal to the singular width $W_1$ of the first phase change material 30. In this embodiment of the present invention, the second phase change material 40 includes a first portion 40a that is in direct physical contact with the interface barrier metal 35 and has a first width $W_2$ that is substantially equal to the singular width $W_1$ of the first phase change material 30 and the interface barrier metal 35, and a second portion 40b having a second width $W_3$ that is greater than the first width $W_2$ of the first portion 40a of the second phase change material 40, wherein the second phase change material 40 has a greater resistivity than the first phase change material 30.

Figure 1C:
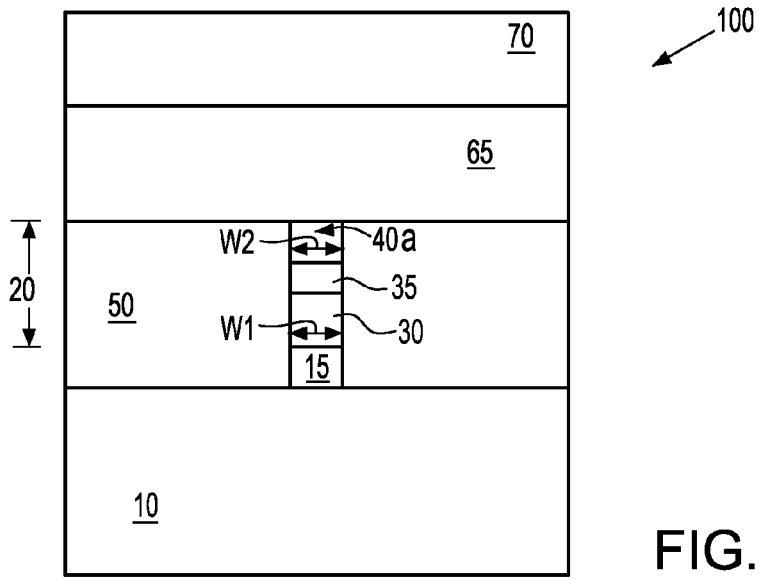
FIG. 1C is a side cross sectional view depicting one embodiment of a phase change memory device including a memory cell having a first portion of a first phase change material and a second portion of a second phase change material, in which the entire second portion of a second phase change material has a width that is substantially equal to the entire first portion of the first phase change material, in accordance with the present invention.

FIG. 1C depicts another embodiment of the inventive memory device 100. In one embodiment, the inventive memory device 100 includes a first phase change material 30 having a singular width $W_1$; and a second phase change material 40 comprising a first portion 40a in direct physical contact with the first phase change material 30 and having a first width $W_2$ substantially equal to the singular width $W_1$ of the first phase change material 30. The components shown and labeled in FIGS. 1A-1C will be described in more detail referring to FIGS. 2A-6.

Figure 2A:
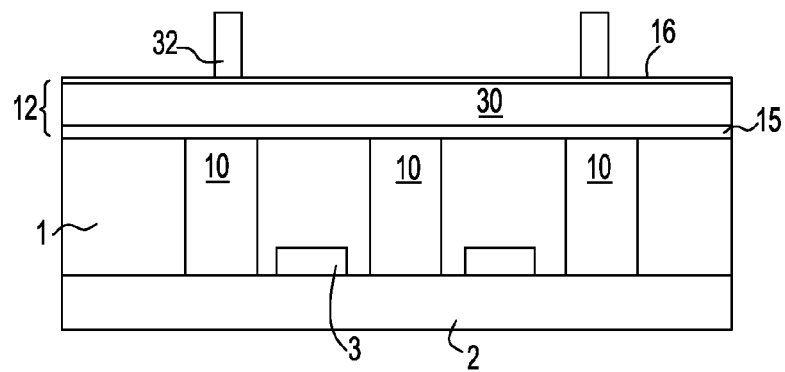
FIG. 2A is a side cross sectional view of one embodiment of an initial structure including a layer of dielectric material having at least one conductive structure; and a stack atop the initial structure including a layer of a first barrier metal and a layer of a first phase change material, as used in accordance with the present invention.

FIGS. 2A-6 depicts one embodiment of the present method for a memory device. FIG. 2A depicts one embodiment of a first dielectric layer 1 including at least one conductive structure 10, i.e. electrically conductive structure, that is positioned atop a substrate 2, such as a semiconducting wafer. In one embodiment, the present method may begin following front end of the line (FEOL) processing, in which the first dielectric layer 1 is provided as part of an interlevel dielectric layer having a plurality of openings that are filled with at least one conductive material to provide conductive structures 10, which may include but is not limited to metal studs and/or metal bars. In one embodiment, the first dielectric layer 1 may include a conductive structure 10 that provides electrical conductivity to a first terminal (source/drain) of a select/access transistor (not shown) that is formed in the underlying substrate 2. In one embodiment, the first dielectric layer 1 may also include at least one metal bar, wherein the metal bar is a conducting line that may be used to provide electrical conductivity to the second (source/drain) terminal of an select/access transistor (not shown) positioned in the underlying substrate 2. In one embodiment, the first dielectric layer 1 may further include a lower conductive line 3. The lower conductive line 3 may be a word line, which may bias the gate of the select/access transistor that links the stud with the metal bar. The substrate 2 may include any number of active and/or passive devices (or regions) located within the substrate 2 or on a surface thereof. For clarity, the active and/or passive devices (or regions) are not shown in the drawings, but are nevertheless meant to be included with substrate 2.

The substrate 2 may include any semiconductor material including, but not limited to: Si, Ge, SiGe, SiC, SiGeC, InAs, GaAs, InP and other III/V compound semiconductors. The substrate 2 may be undoped, or doped. In one example, the doping of a Si-containing substrate may be light (having a dopant concentration of less than 1E17 atoms/cm$^3$) or heavy (having a dopant concentration of about 1E17 atoms/cm$^3$ or greater). The substrate 2 can have any crystallographic orientation such as (100), (110) or (111). Hybrid substrates having at least two planar surfaces of different crystallographic orientation are also contemplated.

In one embodiment, the first dielectric layer 1 is formed atop the substrate 2 using deposition. More specifically, in one embodiment of the invention, the first dielectric layer 1 is formed atop the substrate 2 by a deposition process including, for example, chemical vapor deposition (CVD), plasma-assisted CVD, evaporation, spin-on coating, or chemical solution deposition. The first dielectric layer 1 includes any suitable insulating material that is typically employed in providing vias for interconnects to electrical devices. This includes inorganic dielectrics, organic dielectrics and combinations thereof, including, multilayers thereof. Illustrative examples of suitable materials for the first dielectric layer 1 include, but are not limited to: $SiO_2$, Boron Phospho Silicate Glass (BPSG) oxide, fluorinated $SiO_2$, $Si_3N_4$, organic thermoset or thermoplastic dielectrics such as polyimides, polyarylenes, benzocyclobutenes and the like, spun-on glasses including organosilicate glass (OSG), with or without porosity, such as hydrogen silsesquixoane, methyl silsesquixoane, tetraethylorthosilicate (TEOS) and the like, amorphous alloys of Si, O, C and H, or SiCOH, amorphous alloys of Si, O, F and H.

In one embodiment, the first dielectric layer 1 comprises a low-k dielectric having a thickness ranging from about 10 nm to about 1000 nm. A low-k dielectric has a dielectric constant less than the dielectric constant of $SiO_2$. In another embodiment, the first dielectric layer 1 has a thickness of the order of about 300 nm. In one embodiment, the dielectric constant of the first dielectric layer 1 may be less than about 3.5. In another embodiment, the first dielectric layer 1 may range from about 1.0 to about 3.0. Low-k dielectrics may include organic dielectrics such as low dielectric constant polymer dielectrics or may include low dielectric constant carbon-doped oxides. One example of a low-k dielectric polymer dielectric is SiLK™ (trademark of The Dow Chemical Company). Specifically, SiLK™ is a class of polymer-based low-k dielectric materials comprising a b-staged polymer having a composition including about 95% carbon. An example of a low dielectric constant carbon doped oxide is SiCOH.

After forming the first dielectric layer 1 on a surface of the substrate 2, openings are formed into the first dielectric layer 1 so as to expose portions of the underlying substrate 2, in which conductive structures 10, such as metal studs and/or metal bars are subsequently formed. In one embodiment, the openings are provided with a circular cross section when viewed from the top view. The openings, hereafter referred to as vias, are formed utilizing lithography and etching. For example, the lithographic step may include applying a photoresist to the first dielectric layer 1, exposing the photoresist to a pattern of radiation and developing the pattern into the exposed photoresist utilizing a resist developer. In one embodiment, the etching step used in forming the vias into first dielectric layer 1 may include reactive ion etching (RIE), plasma etching, ion beam etching or laser ablation. Following etching, the photoresist is typically removed from the structure utilizing a resist stripping process, such as oxygen ashing.

In one embodiment, conductive structures 10, such as metal studs and bars, are then formed within the vias in the first dielectric layer 1 using deposition and planarization processes. In one embodiment, a conductive material, such as Cu or W, may be formed within the vias utilizing a deposition process, such as plating or sputtering, filling at least the vias to provide the conductive structures 10. After filling the vias with a conductive material, the structure may be subjected to a planarization process, such as chemical-mechanical polishing and/or grinding, to provide a planar structure.

In one embodiment, an electrically conductive liner is positioned between the conductive structures 10 and the via sidewalls. In one embodiment, the electrically conductive liner may comprise TiN or TaN. In one embodiment, the electrically conductive liner may have a thickness ranging from about 2 nm to about 50 nm. In one embodiment, the electrically conductive liner may be deposited by sputter deposition or by chemical vapor deposition.

Still referring to FIG. 2A, in one embodiment, following the formation of the conductive structures 10, a layered stack 12 is formed atop the upper surface of the first dielectric layer 1 and atop the upper surface 11 of the conductive structures 10. In one embodiment, the layered stack 12 includes a layer of a first barrier metal 15 atop the upper surface of the first dielectric layer 1 and the upper surface 11 of the conductive structures 10; a layer of a first phase change material 30 atop the upper surface of the layer of the first barrier metal 15; and a layer of a sacrificial material 16, which may be an barrier material, atop the upper surface 31 of the layer of the first phase change material 30.

Figure 2B:
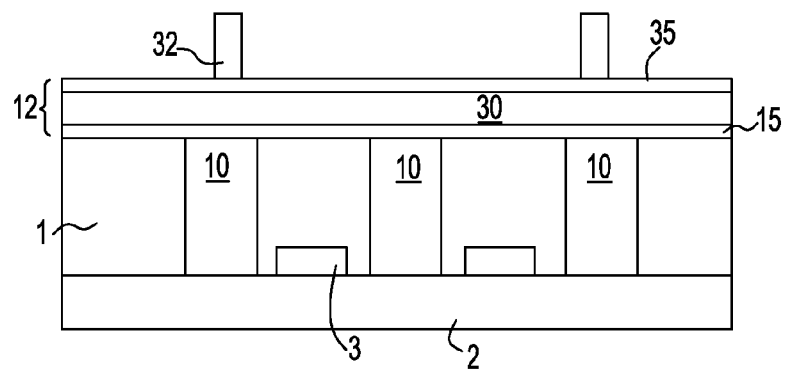
FIG. 2B is a side cross sectional view depicting one embodiment of an initial structure including a layer of dielectric material having at least one conductive structure; and a stack atop the initial structure including a layer of a first barrier metal positioned on an upper surface of the initial structure, a layer of a first phase change material positioned on the layer of the first barrier metal, and a layer of an interface barrier metal positioned on the layer of the first phase change material, as used in accordance with the present invention.

Referring to FIG. 2B, in another embodiment of the present invention in which a interface barrier metal 35 is positioned between the first phase change material 30 and the second phase change material 40, the layered stack 12 that is formed atop the upper surface of the first dielectric layer 1 and the conductive structures 10 includes a layer of a first barrier metal 15 atop the upper surface of the first dielectric layer 1 and the upper surface 11 of the conductive structures 10; a layer of a first phase change material 30 atop the upper surface of the layer of the first barrier metal 15; and an interface barrier metal 35 atop the upper surface 31 of the layer of the first phase change material 30.

In one embodiment, the layer of the first barrier metal 15 or the interface barrier metal 35 is TiN, TaN or a combination thereof. In one embodiment, the layers of the first barrier metal 15 and the interface barrier metal 35 are blanket deposited by a physical deposition process (PVD), such as sputtering. In another embodiment, the layer of the first barrier metal is and/or the layer of the interface barrier metal 35 may be deposited by chemical vapor deposition (CVD). In one embodiment, the layer of first barrier metal 15 may have a thickness ranging from about 0 nm to about 100 nm. In one embodiment, the layer of the interface barrier metal 35 may have a thickness ranging from about 20 nm to about 100 nm. In one embodiment, the first phase change material 30 is by construction in the crystalline state and remains in the crystalline state to serve as the lower electrode to the memory device 100. In one embodiment in which the first phase change material 30 remains in the crystalline state and first phase change material 30 functions as the lower electrode to the memory device, the first phase change material 30 is in direct physical contact with the second phase change material 40. In another embodiment, in which the interface barrier metal 35 is present, the interface barrier metal 35 serves as the lower electrode to the memory device 100. In one embodiment when the interface barrier metal 35 functions as the lower electrode, the interface barrier metal 35 is in direct physical contact with the second phase change material 40.

In one embodiment, the first phase change material 30 may be composed of an essentially pure phase change material composition. For example, in one embodiment, the first phase change material 30 may be composed of $Ge_2Sb_2Te_5$ (GST) without any purposeful additional of oxide, nitride or oxynitride dopants. In another embodiment, the first phase change material 30 may be composed of a GeSb alloy. In one embodiment when the first phase change material 30 is a GeSb alloy, the composition of the GeSb alloy is approximately $Ge_8Sb_{12}$. In one embodiment, the resistivity of the first phase change material 30 ranges from about $10^{-6}$ ohm-m to about $10^2$ ohm-m. In one embodiment, the thermal conductivity of the first phase change material 30 ranges from about 0.02 W/mK to about 2 W/mK.

The first phase change material 30 may be switched from an amorphous phase to a crystalline phase. In one embodiment, when in an amorphous state, the first phase change material 30 exhibits a high resistivity, typically ranging from about $10^{-2}$ ohm-m to about $10^2$ ohm-m. In one embodiment, when in a crystalline state, the first phase change material 30 is more conductive, exhibiting a lower room temperature resistivity typically ranging from about $10^{-6}$ ohm-m to about $10^{-4}$ ohm-m.

It is noted that other materials have been contemplated for the first phase change material 30 and are within the scope of the present invention, so long as the material selected for the first phase change material 30 provides a lower resistivity in the crystalline state than the material selected for the second phase change material 40 in the crystalline state. For example, in one embodiment, the first phase change material 30 may comprise chalcogenide alloys. The term chalcogenide is used herein to denote an alloy or compound material, which contains at least one element from Group VI of the Periodic Table of Elements. Illustrative examples of chalcogenide alloys that can be employed for the first phase change material 30 may include, but are not limited to, alloys of Te or Se with at least one of the elements of Ge, Sb, As, Si. In other embodiments, the first phase change material 30 may be composed of any suitable material including one or more of the elements Te, Ga, In, Se, and S. Although chalcogenides are a group of materials commonly utilized as phase change material, some phase change materials, such as GeSb (GS), do not utilize, chalcogenides and in some embodiments of the present invention may be equally suitable for the first phase change material 30. Thus, a variety of materials can be used in a first phase change material 30 so long as they can retain separate amorphous and crystalline states of distinct resistivity.

In one embodiment, the first phase change material 30 is composed of GST and is in an amorphous phase when at a temperature of about 25° C. As the temperature of the first GST phase change material 30 is increased to about 125° C. to about 150° C., the resistivity of the first GST phase change material 30 decreases representing the transition temperature for a phase change from an amorphous phase to Face Center Cubic (FCC) phase. Further increases in the temperature of the first GST phase change material 30 to greater than about 180° C. result in further decreases in resistivity, which result from a phase change from the Face Centered Cubic (FCC) phase to a Hexagonal (Hex) phase of the first phase change material 30. When the temperature of the first GST phase change material 30 is increased above the melting temperature (i.e., 620° C.), the first GST phase change material 30 melts and upon quench returns to the amorphous solid phase. The term "quench" denotes solidification in a time period on the order of about 0.5 to about 50 nanoseconds.

In at least one embodiment of the present invention, the phase change materials, i.e. first phase change material 30 and second phase change material 40, are in the crystalline state prior to the cycling of the memory cell 100 due to the typical processing temperatures that are used to construct the memory cell 100. In at least one embodiment of the present invention, because of the lower resistivity of the first phase change material 30 compared to that of the second phase change material 40, the first phase change material 30 remains in the crystalline stage during memory cell 100 operation, since the power is dissipated mainly in the second phase change material 40. Furthermore, in at least one embodiment of the invention, the first phase change material 30 provides thermal insulation for the memory cell 100 while preserving conductivity to the second phase change material 40 so that the rest power is reduced.

The layer of the first phase change material 30 may be deposited atop the layer of the first barrier layer 15 using physical vapor deposition (PVD), such as sputtering, or may be deposited by chemical vapor deposition. Chemical Vapor Deposition (CVD) is a deposition process in which a deposited species is formed as a result of chemical reaction between gaseous reactants at greater than room temperature (25° C. to 600° C.); wherein solid product of the reaction is deposited on the surface on which a film, coating, or layer of the solid product is to be formed. Variations of CVD processes include, but not limited to, Atmospheric Pressure CVD (APCVD), Low Pressure CVD (LPCVD) and Plasma Enhanced CVD (EPCVD), Metal-Organic CVD (MOCVD) and combinations thereof may also be employed. In one embodiment, the layer of the first phase change material 30 may have a thickness ranging from about 20 nm to about 200 nm.

In one embodiment, the layer of sacrificial material 16 that is positioned atop the layer of the first phase change material 30 is a barrier metal, such as TiN or TaN, In one embodiment, the layer of the sacrificial material 16 is blanket deposited by a physical deposition process, such as sputtering. In another embodiment, the sacrificial material 16 may be deposited by chemical vapor deposition. In one embodiment, the sacrificial material 16 may have a thickness ranging from about 20 nm to about 200 mm. It is noted that other materials that are not reactive with the phase change material, i.e. first phase change material 30, have been contemplated for the sacrificial material 16 and are within the scope of the present invention. For example, the sacrificial material 16 may be a nitride. In one embodiment, the sacrificial material 16 functions to protect the first phase change material 30 from the chemistry of a subsequently conducted lithography process or acts as hard mask during a subsequently conducted etch processes, such as reactive ion etch (RIE).

In the embodiments of the present invention that include the interface barrier metal 35 positioned between the first phase change material 30 and the second phase change material 40, as depicted in FIGS. 1B and 2B, the interface barrier metal 35 is deposited atop the layer of the first phase change material 30, and is composed of a barrier metal, such as TiN or TaN. In one embodiment, the layer of the interface barrier metal 35 is blanket deposited by a physical deposition process (PVD), such as sputtering. In another embodiment, the layer of the interface barrier metal 35 is deposited by chemical vapor deposition (CVD). In one embodiment, the interface barrier metal 35 has a thickness ranging from about 20 nm to about 200 nm. It is noted that other materials that are non-reactive with phase change materials, i.e., the first phase change material 30 and the second phase change material 40, have been contemplated for the interface barrier metal 35 and are within the scope of the present invention.

Figure 3:
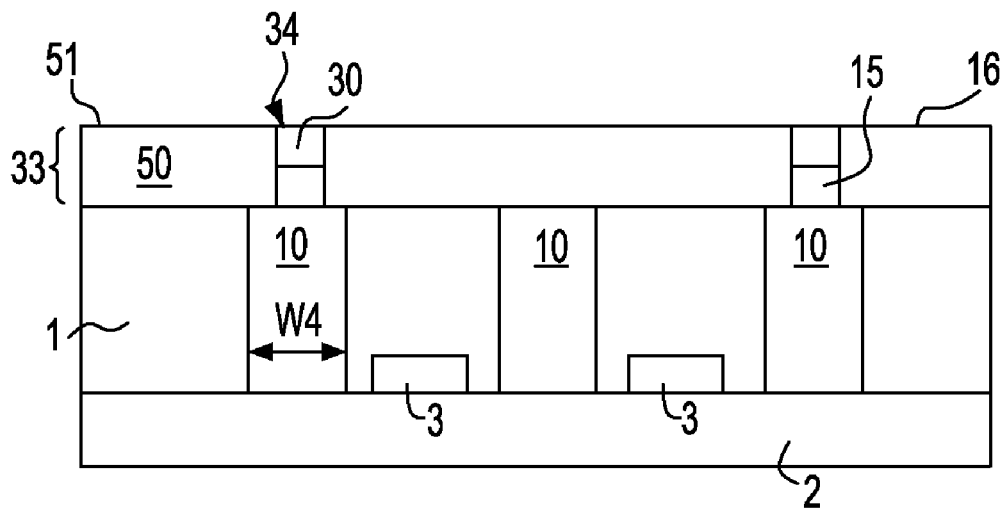
FIG. 3 is a side cross sectional view depicting a structure following the patterning of the stack to provide a pillar; and the forming of the first insulating layer having an upper surface co-planar with the upper surface of the pillar, in accordance with one embodiment of the present invention.

In one embodiment following the formation of the layer of the sacrificial material 16, as depicted in FIG. 2A, or the layer of the interface barrier metal 35, as depicted in FIG. 2B, a pillar 33, as shown in FIG. 3, is formed utilizing photolithography and etch processes. It is noted that although FIGS. 3-6 depict the sacrificial material 16, and not the layer of the interface barrier metal 35, that FIG. 3-6 are equally applicable to the embodiments of the invention that include the interface barrier metal 35 and the embodiments of the invention in which the interface barrier metal 35 is omitted.

As used herein, a pillar is a structure that provides the dimensions for a subsequently formed cavity, which may also be referred to as a pore. More specifically, in one embodiment, a block mask 32 is formed atop a portion of the layer of the sacrificial material 16, or the interface metal barrier 35, wherein a remaining portion of the sacrificial material 16 is exposed. In one embodiment, the block mask 32 may be formed from a photoresist layer. In another embodiment, the block mask 32 may be provided by a hard mask.

Referring to FIGS. 2A and 2B, following block mask 32 formation, the exposed portion of the sacrificial material 16, or the exposed portion of the interface barrier metal 35, and the portions of the first phase change material 30 and first barrier metal 15 underlying the exposed portion of the sacrificial material 16, or the exposed portion of the interface barrier metal 35, are removed by an anisotropic etch step to provide the pillar 33. In one embodiment, the anisotropic etch step includes a first etch step for removing the exposed portions of the sacrificial material 16, or the interface barrier metal 35, selective to the first phase change material 30; a second etch step for removing the first phase change material 30 selective to the first barrier metal 15; and a third etch step for removing the first barrier metal 15 selective to the first dielectric layer 1 and the conductive region 10. In another embodiment of the present invention, the above described first, second and third etch steps for providing the pillar 33 each include a similar etch chemistry.

In one embodiment, width $W_4$ of the conductive structure 10 is greater than the width $W_1$ of the pillar 33. In one embodiment, the width $W_4$ of the conductive structure 10 ranges from about 90 nm to about 400 nm. In another embodiment, the width $W_4$ of the conductive structure 10 ranges from about 45 nm to about 250 nm. In yet another embodiment, the width $W_4$ of the conductive region 10 ranges from about 22 nm to about 100 nm. In one embodiment, the width $W_1$ of the pillar 33 ranges from about 40 nm to about 100 nm. In another embodiment, the width $W_1$ of the pillar 33 ranges from about 30 nm to about 60 nm. In a further embodiment, the width $W_1$ of the pillar 33 ranges from about 10 nm to about 40 nm. It is noted that embodiments of the present invention have been contemplated in which the pillar 33 is provided without the first barrier metal 15, wherein the block mask 32 is formed atop the layer of the sacrificial layer 16 or barrier contact 160. Following the formation of the pillar 33, the block mask 32 may be removed by an oxygen ash.

FIG. 3 depicts one embodiment of forming an insulating material 50 atop at least the exposed portions of the conductive structure 10 adjacent the portion of the conductive structure 10 on which the pillar 33 is positioned, wherein an upper surface 51 of the insulating material 50 is planarized to be substantially co-planar with an upper surface 34 of the pillar 33. In one embodiment, the insulating material 50 may be an oxide, nitride, oxynitride or combination thereof. In one embodiment, the insulating material 50 is an oxide that is deposited by chemical vapor deposition. In one embodiment, the insulating material may be composed of high density plasma (HDP) chemical vapor deposition (CVD) deposited silicon oxide having a thickness ranging from about 10 nm to about 300 nm. HDPCVD is a chemical vapor deposition process that utilizes a low pressure (2-10-mTorr range) to achieve a high electron density ($10^{10}$ cm$^3$-$10^{12}$ cm$^3$) and a high fractional ionization rate ($10^{-4}$ to $10^{-1}$) for deposition.

Following deposition, the insulating material 50 may be planarized to expose the upper surface of the first phase change material 30, or the upper surface of the interface barrier metal 35. Planarization is a material removal process that employs at least mechanical forces, such as frictional media, to produce a planar surface. In one embodiment, the insulating material 50 may be planarized by chemical mechanical polishing (CMP). Chemical Mechanical Planarization is a material removal process using both chemical reactions and mechanical forces to remove material and planarize a surface. In one embodiment, the insulating material 50 is planarized until the upper surface 34 of the first phase change material 30 of the pillar 33 is exposed.

Figure 4:
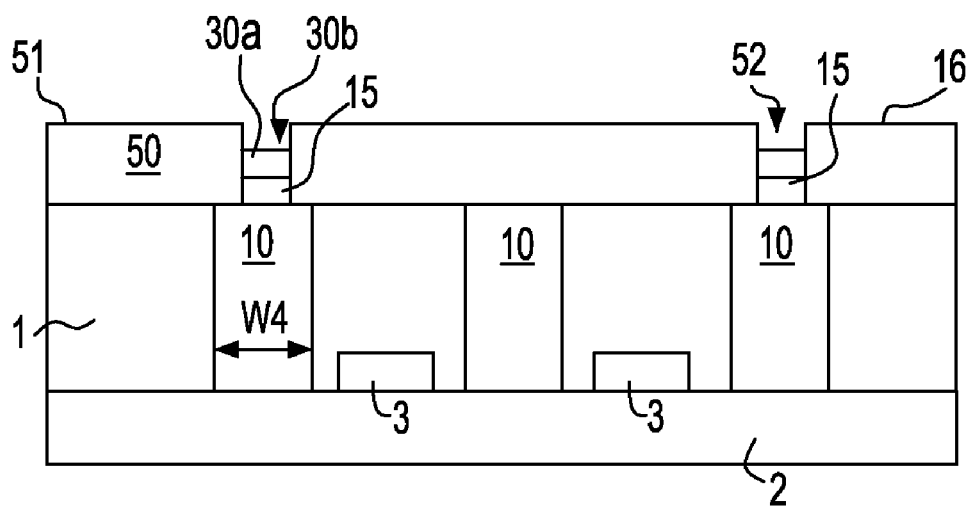
FIG. 4 is a side cross sectional view depicting recessing the first phase change material below an upper surface of the insulating material, in accordance with one embodiment of the present invention.

FIG. 4 is a side cross sectional view depicting recessing of the upper surface 34 of the first phase change material 30 of the pillar 33 below an upper surface 51 of the insulating material 50 to provide a recessed first phase change material 30a, in accordance with one embodiment of the present invention. In one embodiment, the upper surface 34 of the first phase change material 30 is etched using an anisotropic etch process, i.e., Reactive Ion Etching (RIE), selective to the insulating material 50. In one embodiment, the first phase change material 30 is composed of high purity $Ge_2Sb_2Te_5$ and the insulating material is composed of $SiO_2$, recessing the first phase change material 30 includes reactive ion etch processing with a chlorine containing plasma, such as $Cl_2$/Ar. In another embodiment, the reactive ion etch chemistry may be a fluorine containing plasma, such as $CF_4$/$CHF_3$/Ar. In another embodiment, the upper surface 34 of the first phase change material 30 is etched using a wet chemistry, such as diluted hydrofluoric acid (DHF). In one embodiment, the etch process is a timed etch. In one embodiment, the upper surface 30b of the recessed first phase change material 30a is at a depth ranging from about 10 nm to about 180 nm from the upper surface 51 of the insulating material 50 to provide a cavity 52. In another embodiment, the recessed first phase change material 30a is at a depth ranging from about 10 nm to about 80 nm from the upper surface 51 of the insulating material 50. In a further embodiment, the recessed first phase change material 30a is at a depth ranging from about 10 nm to about 50 nm from the upper surface 51 of the insulating material 50. It is noted that although the first barrier metal 15 is depicted in the supplied figures, the first barrier metal 15 is optional, and embodiments of the present invention have been contemplated, in which the barrier metal 15 has been omitted.

In at least one of the embodiments of the present invention that include the interface barrier material 35 between the first phase change material 30 and the second phase change material 40, the interface barrier metal 35 atop the first phase change material 30 of the pillar 33 is recessed with an etch process selective to the upper surface 51 of the insulating material 50 using a $Cl_2$/Ar chemistry.

Figure 5:
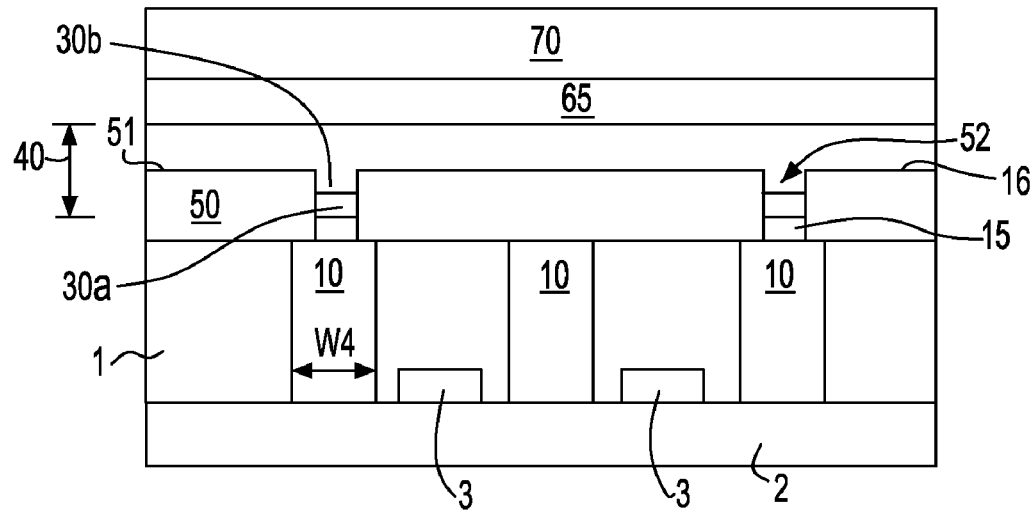
FIG. 5 is a side cross sectional view depicting one embodiment of a forming a second phase change material atop a recessed first phase change material and atop the upper surface of the insulating material, in accordance with the present invention.

FIG. 5 is a side cross sectional view depicting the formation of a second phase change material 40 atop the recessed first phase change material 30a and the upper surface 51 of the insulating material 50, in accordance with at least one embodiment of the present invention. Similar to the first phase change material 30, the second phase change material 40 may be switched from an amorphous phase to a crystalline phase. In one embodiment, the second phase change material 40 may be composed of $Ge_2Sb_2Te_5$ that is doped with dopants composed of oxides, nitrides, oxynitride or combinations thereof. In one embodiment, the second phase change material 50 may be composed of $Ge_2Sb_2Te_5$ including $Si_3N_4$ or $SiO_2$ dopants present in approximately 5 wt. % to approximately 10 wt. %.

In one embodiment, the second phase change material 40 may be deposited by physical vapor deposition (PVD), such as sputtering, or chemical vapor deposition (CVD). In one embodiment, the dopant may be introduced to the second phase change material 40 during the deposition process. In some embodiments of the present invention, the dopants may be added to the second phase change material 40 utilizing at least one of ion implantation, gas phase doping, dopant out diffusion or a combination thereof. In one embodiment, the second phase change material 40 may be composed of $Ge_2Sb_2Te_5$ doped with $Si_3N_4$ or $SiO_2$ dopants, wherein the $Ge_2Sb_2Te_5$ is co-sputtered with the dopant. Dopants can be included either in the primary target, or co sputtered from other targets. In one embodiment, the room temperature resistivity of the second phase change material layer 40 ranges from about $10^{-2}$ ohm-m to about $10^{+5}$ ohm-m.

Similar to the first phase change material 30, when in an amorphous state the second phase change material 40 exhibits a high resistivity, typically ranging from about 1 ohm-m to about $10^3$ ohm-m. In one embodiment, when in a crystalline state, the second phase change material 40 is more conductive, exhibiting a lower resistivity typically ranging from about $10^{-2}$ ohm-m to about 1 ohm-m.

It is noted that other materials have been contemplated for the second phase change material 40 and are within the scope of the present invention, so long as the material selected for the second phase change material 40 provides a lower resistivity than the material selected for the first phase change material 30. For example, in one embodiment, the second phase change material 40 may comprise chalcogenide alloys. Illustrative examples of chalcogenide alloys that can be employed for the second phase change material 40 include, but are not limited to, alloys of Te or Se with at least one of the elements of Ge, Sb, As, Si. In other embodiments, the second phase change material 40 is composed of any suitable material including one or more of the elements Te, Ga, In, Se, and S, so long as the material is capable of phase change and has a resistivity greater than the first phase change material 30. It is noted that the second phase change material 40 may be composed of a non-chalcogenide material, such as GeSb. Thus, a variety of materials can be used for the second phase change material 40 so long as they can retain separate amorphous and crystalline states of distinct resistivity, and have a resistivity greater than the first phase change material 30.

In one embodiment, the second phase change material 40 is composed of doped $Ge_2Sb_2Te_5$ (GST) and is in an amorphous phase when at a temperature of about 25° C. As the temperature of the second GST phase change material 40 is increased to about 180° C. to about 280° C., the resistivity of the phase change material decreases representing the transition temperature for a phase change from an amorphous phase to Face Center Cubic (FCC) phase. Further increases in the temperature of the second GST phase change material to greater than about 180° C. result in further decreases in resistivity, which result from a phase change from the Face Centered Cubic (FCC) phase to a Hexagonal (Hex) phase of the second phase change material 40. When the temperature of the second GST phase change material 40 is increased above the melting temperature (620° C.), the second GST phase change material 40 melts and upon quench returns to the amorphous solid phase.

In one embodiment, the second phase change material 40 may be deposited atop the recessed first phase change material 30a using a single deposition and planarization step. For example, in one embodiment, the second phase change material 40 is deposited to fill the cavity 52 and extend atop the upper surface 51 of the insulating material 50, wherein following deposition a planarization step, such as CMP, is conducted to provide a second phase change material 40 having a planar upper surface. The first portion 40a of the second phase change material 40 may be contained within the via. The second portion 40b of the phase change material 40 may be positioned atop the first portion 40a of the phase change material 40 and extends atop the insulating material 50. In another embodiment, the planarization step is omitted.

In another embodiment, the second phase change material 40 may be deposited using a two step deposition and planarization process. For example, in a first deposition step the first portion 40a of the second phase change material 40 may be deposited to fill the cavity 52, wherein the portion of the second phase change material 40a within the cavity 52 is planarized to provide an upper surface substantially coplanar to the insulating material 50. Thereafter, a second layer of the second phase change material 40 is deposited atop the coplanar upper surface of the insulating material 50 and the second phase change material 40 within the cavity 52 to provide the second portion 40b of the second phase change material 40.

In another embodiment, the second phase change material 40 may be deposited using a single deposition and planarization process. For example, in a first deposition step the second phase change material 40 may be deposited to fill the cavity 52, wherein the portion of the second phase change material 40a within the cavity 52 is planarized to provide an upper surface substantially coplanar to the insulating material 50, as depicted in FIG. 1C.

Referring to FIG. 5, in a following process step the second barrier metal 65 may be optionally deposited top the second phase change material 40. The second barrier metal 65 may be TiN, TaN or a combination thereof. In one embodiment, the second barrier metal 65 is blanket deposited by a physical vapor deposition (PVD) process, such as sputtering. In another embodiment, the second barrier metal 65 may be deposited by chemical vapor deposition (CVD). In one embodiment, the second barrier metal 65 may have a thickness ranging from about 20 nm to about 200 nm.

In a following step, an upper electrode 70 may be formed atop the second barrier metal 65. The upper electrode 70 is formed by physical vapor deposition, such as plating or sputtering. In one embodiment, the upper electrode 70 is composed of tungsten, copper, aluminum, silver, gold and multilayers and alloys thereof. In one embodiment, the upper electrode 70 may have a thickness ranging from about 100 nm to about 700 nm. In one embodiment, the upper electrode 70 may further include a silicide surface (not shown).

Figure 6:
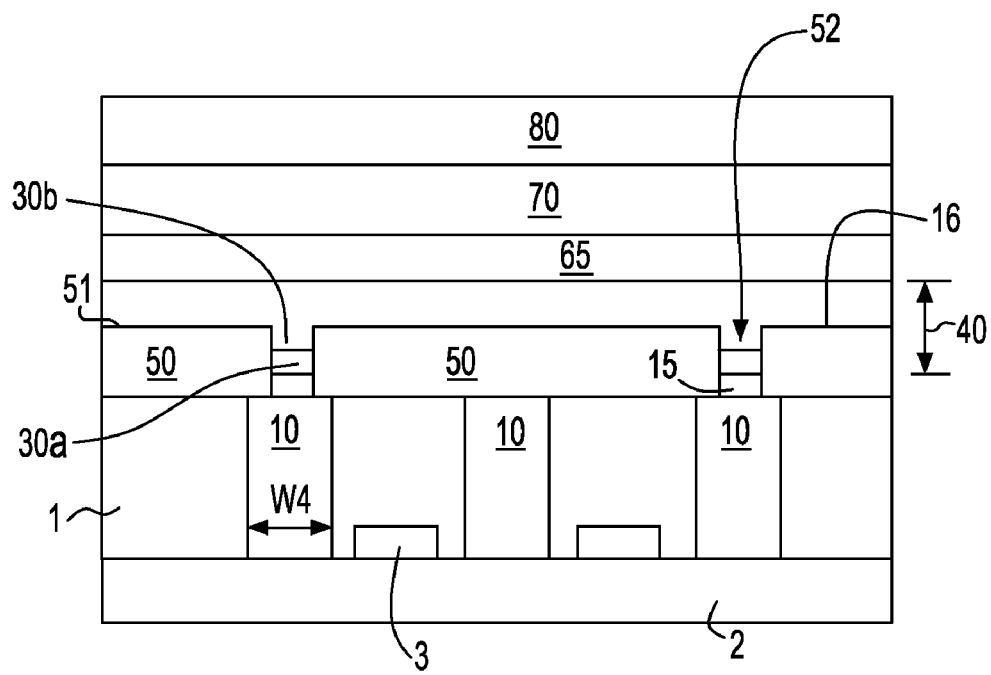
FIG. 6 is a side cross sectional view depicting the formation of electrodes to the phase change memory device, in accordance with one embodiment of the present invention.

Following formation of the upper electrode 70, a passivation layer 80 of dielectric material is blanket deposited atop the entire structure and planarized, as depicted in FIG. 6. The passivation layer 80 may be selected from the group consisting of silicon-containing materials such as $SiO_2$, $Si_3N_4$, SiOxNy, SiC, SiCO, SiCOH, and SiCH compounds; the above-mentioned silicon-containing materials with some or all of the Si replaced by Ge; carbon-doped oxides; inorganic oxides; inorganic polymers; hybrid polymers; organic polymers such as polyamides or SiLK™; other carbon-containing materials; organo-inorganic materials such as spin-on glasses and silsesquioxane-based materials; and diamond-like carbon (DLC, also known as amorphous hydrogenated carbon, a-C:H).

The passivation layer 80 may be formed by various methods including but not limited to: spinning from solution, spraying from solution, chemical vapor deposition (CVD), plasma enhanced CVD (PECVD), sputter deposition, reactive sputter deposition, ion-beam deposition, and evaporation. The passivation layer 80 may then patterned and etched to forth via holes (not shown) to the various source/drain and gate conductor regions of the substrate. Following via formation, interconnects (not shown) are formed by depositing a conductive metal into the via holes using conventional processing, such as CVD or plating. The conductive metal may include, but is not limited to: tungsten, copper, aluminum, silver, gold, and alloys thereof.

While the present invention has been particularly shown and described with respect to the preferred embodiments thereof it will be understood by those skilled in the art that the foregoing and other changes in forms of details may be made without departing form the spirit and scope of the present invention. It is therefore intended that the present invention not be limited to the exact forms and details described and illustrated, but fall within the scope of the appended claims.

What is claimed:

1. A method of manufacturing an electrode comprising:
   providing a pillar of at least a first phase change material positioned on a conductive structure positioned in a dielectric layer, wherein the first phase change material includes at least one of Te, Ga, In, Se and S;
   forming an insulating material abutting the pillar of the first phase change material and atop the conductive structure, wherein an upper surface of the insulating material is coplanar with an upper surface of the pillar;
   recessing the upper surface of the pillar below the upper surface of the insulating material to provide a recessed pillar; and
   forming a second phase change material atop the recessed pillar and the upper surface of the insulating material, the second phase change material includes at least one of Te, Ga, In, Se and S, wherein the second phase change material has a greater phase resistivity than the first phase change material.

2. The method of claim 1, wherein the first phase change material is in direct physical contact with the second phase change material.

3. The method of claim 1, wherein the pillar further comprises a first barrier metal positioned between the first phase change material and the conductive structure.

4. The method of claim 1, wherein the conductive structure has a greater width than the pillar.

5. The method of claim 1, wherein the providing of the pillar comprises:
   depositing a layer of the first barrier metal atop the conductive structure and the dielectric layer;
   depositing a layer of the first phase change material atop the layer of the first barrier metal;
   forming a block mask atop a portion of the layer of the first phase change material, wherein a remaining portion of the layer of the first phase change material is exposed;
   removing the remaining portion of the layer of the first phase change material and portions of the first barrier metal underlying the remaining portion of the layer of the first phase change material with an anisotropic etch step; and
   removing the block mask.

6. The method of claim 1, wherein the first phase change material comprises high purity $Ge_2Sb_2Te_5$.

7. The method of claim 1, wherein the recessing of the upper surface of the pillar below the upper surface of the insulating material to provide the recessed pillar comprises etching the first phase change material selective to the insulating material until the upper surface of the pillar is recessed to a depth below the upper surface of the insulating material to provide a cavity atop a recessed first phase change material.

8. The method of claim 7, wherein the step of the forming of the second phase change material atop the recessed first phase change material and the upper surface of the insulating material comprises:
   depositing a first layer of the second phase change material atop the recessed phase change material and the insulating material; and
   forming a second barrier metal atop the second phase change material.

9. The method of claim 7, wherein the step of the forming of the second phase change material atop the recessed first phase change material and the upper surface of the insulating material comprises:
   depositing a first layer of the second phase change material atop the recessed phase change material and the insulating material;
   planarizing the first layer of the second phase change material until an upper surface of the second phase change material within the cavity is coplanar with the upper surface of the insulating material;
   depositing a second layer of the phase change material atop the upper surface of the second phase change material within the cavity and the upper surface of the insulating material; and
   forming a second barrier metal atop the second phase change material.

10. The method of claim 1, wherein the second phase change material comprises $Ge_2Sb_2Te_5$ doped with a nitride, oxide, or oxynitride.

11. A method of manufacturing an electrode comprising:
    providing a pillar of at least a first phase change material positioned on a conductive structure positioned in a dielectric layer;
    forming an insulating material abutting the pillar of the first phase change material and atop the conductive structure, wherein an upper surface of the insulating material is coplanar with an upper surface of the pillar;
    recessing the upper surface of the pillar below the upper surface of the insulating material to provide a recessed pillar;
    forming an interface barrier metal on an upper surface of the first phase change material of the recessed pillar; and
    forming a second phase change material atop the interface barrier metal of the recessed pillar and the upper surface of the insulating material, wherein the second phase change material has a greater phase resistivity than the first phase change material.

12. The method of claim 11, wherein the interface barrier metal is in direct physical contact with the first phase change material and the second phase change material.

13. The method of claim 11, wherein the providing of the pillar comprises:
    depositing a layer of the first phase change material atop the layer of the first barrier metal;

depositing a layer of the interface barrier metal atop the layer of the first phase change material;

forming a block mask atop a portion of the layer of the interface barrier metal, wherein a remaining portion of the layer of the interface barrier metal is exposed;

removing the remaining portion of the layer of the interface barrier metal and portions of the first phase change material and first barrier metal underlying the remaining portion of the layer of interface barrier metal with an anisotropic etch step; and removing the block mask.

14. The method of claim 11, wherein the first phase change material is a GeSb alloy.

15. The method of claim 11, wherein the recessing of the upper surface of the pillar below the upper surface of the insulating material to provide the recessed pillar comprises etching the interface barrier metal selective to the insulating material until the upper surface of the pillar is recessed to a depth below the upper surface of the insulating material to provide a cavity atop a recessed interface barrier metal.

16. The method of claim 15, wherein the step of the forming of the second phase change material atop the recessed interface barrier metal and the upper surface of the insulating material comprises:

depositing a first layer of the second phase change material atop the recessed interface barrier metal and the insulating material;

planarizing the first layer of the second phase change material until an upper surface of the second phase change material within the cavity is coplanar with the upper surface of the insulating material; and forming a second barrier metal atop the second phase change material.

17. The method of claim 15, wherein the step of the forming of the second phase change material atop the recessed interface barrier metal and the upper surface of the insulating material comprises:

depositing a first layer of the second phase change material atop the recessed interface barrier metal and the insulating material;

planarizing the first layer of the second phase change material until an upper surface of the second phase change material within the cavity is coplanar with the upper surface of the insulating material;

depositing a second layer of the phase change material atop the upper surface of the second phase change material within the cavity and the upper surface of the insulating material; and forming a second barrier metal atop the second phase change material.

18. The method of claim 11, wherein the interface barrier metal comprises TiN or TaN.

* * * * *